(12) United States Patent
Kim et al.

(10) Patent No.: US 10,069,469 B2
(45) Date of Patent: Sep. 4, 2018

(54) ADAPTIVE BIAS CIRCUIT FOR A RADIO FREQUENCY (RF) AMPLIFIER

(71) Applicant: QUALCOMM INCORPORATED, San Diego, CA (US)

(72) Inventors: Woonyun Kim, San Diego, CA (US); Chang-Ho Lee, San Diego, CA (US); Minsik Ahn, San Diego, CA (US); Jeongwon Cha, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/271,518

(22) Filed: Sep. 21, 2016

(65) Prior Publication Data

US 2017/0222608 A1 Aug. 3, 2017

Related U.S. Application Data

(60) Provisional application No. 62/288,473, filed on Jan. 29, 2016.

(51) Int. Cl.
| | |
|---|---|
| *H03F 3/04* | (2006.01) |
| *H03F 3/45* | (2006.01) |
| *H03F 3/193* | (2006.01) |
| *H03F 1/02* | (2006.01) |
| *H03F 3/24* | (2006.01) |

(52) U.S. Cl.
CPC ....... *H03F 3/45179* (2013.01); *H03F 1/0266* (2013.01); *H03F 3/193* (2013.01); *H03F 3/245* (2013.01); *H03F 3/45188* (2013.01); *H03F 2200/165* (2013.01); *H03F 2200/168* (2013.01); *H03F 2200/18* (2013.01); *H03F 2200/294* (2013.01); *H03F 2200/336* (2013.01); *H03F 2200/451* (2013.01); *H03F 2203/45244* (2013.01)

(58) Field of Classification Search
CPC .... H03F 1/0211; H03F 1/0222; H03F 1/0238; H03F 2200/216
USPC ......................................... 330/136, 285, 296
See application file for complete search history.

(56) References Cited

U.S. PATENT DOCUMENTS

| | | |
|---|---|---|
| 6,819,180 B2 | 11/2004 | Krvavac |
| 7,567,123 B2 | 7/2009 | Leung et al. |
| 8,378,749 B1 | 2/2013 | Kim et al. |
| 2011/0115572 A1* | 5/2011 | Chan ........................ H04B 1/48 333/32 |

(Continued)

FOREIGN PATENT DOCUMENTS

GB 2455555 A 6/2009

OTHER PUBLICATIONS

Chen Y.J.E., et al., "A High-Efficient CMOS RF Power Amplifier with Automatic Adaptive Bias Control," IEEE Microwave and Wireless Components Letters, Nov. 2006, vol. 16 (11), pp. 615-617.

(Continued)

*Primary Examiner* — Steven J Mottola
(74) *Attorney, Agent, or Firm* — Smith Tempel Blaha LLC/Qualcomm

(57) ABSTRACT

A circuit includes a first transistor comprising a gate, a source, and a drain, and an inductor coupled between the gate and the source of the first transistor, wherein the source is further coupled to a current source and the gate is further coupled to an amplifier.

22 Claims, 12 Drawing Sheets

(56) References Cited

U.S. PATENT DOCUMENTS

2013/0113447 A1    5/2013  Kadanka
2016/0308523 A1*  10/2016  Otake .............. H03K 17/04106

OTHER PUBLICATIONS

Kim W., et al., "An EDGE/GSM Quad-Band CMOS Power Amplifier" Samsung Electro-Mechanics, 2011, IEEE International Solid-State Circuits Conference, ISSCC, Feb. 23, 2011, 3 pages.

Koo B., et al., "Integrated Bias Circuits of RF CMOS Cascode Power Amplifier for Linearity Enhancement," IEEE Transactions on Microwave Theory and Techniques, Feb. 2012, vol. 60 (2), pp. 340-351.

Ye F., et al., "Dynamic Bias Circuits for Efficiency Improvement of RF Power Amplifier," Tamkang Journal of Science and Engineering, 2004, vol. 7 (3), pp. 183-188.

Hsiao Y-H., et al., A V-Band Power Amplifier with Adaptive Bias Circuit to Save Quiescent DC Power Consumption Using 90-nm CMOS Technology 2014 Asia-Pacific Microwave Conference, IEICE, Nov. 4, 2014 (Nov. 4, 2014), XP032750487, pp. 157-159.

International Search Report and Written Opinion—PCT/US2017/012237—ISA/EPO—dated Apr. 5, 2017.

* cited by examiner

ADAPTIVE BIAS CIRCUIT FOR A RADIO FREQUENCY (RF) AMPLIFIER

RELATED APPLICATIONS

This application claims the benefit of U.S. Provisional Patent Application No. 62/288,473, entitled "Adaptively Controlled Bias Circuit For A Radio Frequency (RF) Amplifier," filed Jan. 29, 2016, the contents of which are hereby incorporated by reference in their entirety.

FIELD

The present disclosure relates generally to electronics, and more specifically to transmitters and receivers.

BACKGROUND

In a radio frequency (RF) transceiver, a communication signal is typically amplified and transmitted by a transmit section. A transmit section may comprise one or more circuits that amplify and transmit the communication signal. The amplifier circuit or circuits may comprise one or more amplifier stages that may include one or more driver stages and one or more power amplifier stages. Each of the amplifier stages typically comprises one or more transistors configured in various ways to amplify the communication signal. One or more of the transistors that are configured to amplify the communication signal are biased based on a number of different parameters and factors. A bias circuit is typically used to establish the parameters under which the communication signal is amplified. Correctly biasing the amplifiers is desirable so that the communication signal may be appropriately amplified and transmitted.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a circuit including a first transistor comprising a gate, a source, and a drain, and an inductor coupled between the gate and the source of the first transistor, wherein the source is further coupled to a current source and the gate is further coupled to an amplifier.

Another aspect of the disclosure provides a circuit, including means for providing a first bias signal at a first power level to means for amplifying, and means for providing a second bias signal at a second power level to the means for amplifying, the means for providing the second bias signal being coupled between the means for providing the first bias signal and the means for amplifying.

Another aspect of the disclosure provides a method for biasing an amplifier including providing a radio frequency (RF) input signal to an amplifier, the amplifier configured to provide an output signal, providing a bias signal to the amplifier when the RF input is at a first power level, providing an additional bias signal to the amplifier when the RF input signal is at a second power level, and providing a low impedance input to the amplifier.

Another aspect of the disclosure provides an amplifier system including an amplifier configured to receive a radio frequency (RF) input signal, a current source configured to provide a bias signal to the amplifier corresponding to a first power level, and an additional circuit coupled between the current source and the amplifier, the additional circuit configured to provide an additional bias signal to the amplifier corresponding to a second power level, the additional circuit also configured to provide a low impedance path between the current source and the amplifier.

Another aspect of the disclosure provides a device including means for providing a radio frequency (RF) input signal to an amplifier, the amplifier configured to provide an output signal, means for providing a bias signal to the amplifier when the RF input signal is at a first power level, means for providing an additional bias signal to the amplifier when the RF input signal is at a second power level, and means for providing a low impedance input to the amplifier.

Another aspect of the disclosure provides a bias circuit for an amplifier including a current source configured to provide a bias signal to an amplifier at a first power level, and an additional circuit coupled between the current source and the amplifier, the additional circuit configured to provide an additional bias signal to the amplifier at a second power level, the additional circuit also configured to provide a low impedance path between the current source and the amplifier at the first power level and at the second power level.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

Exemplary embodiments of the disclosure are directed to an adaptive bias circuit for a radio frequency (RF) amplifier and elements thereof, for example a boost circuit and elements thereof.

Figure 1:
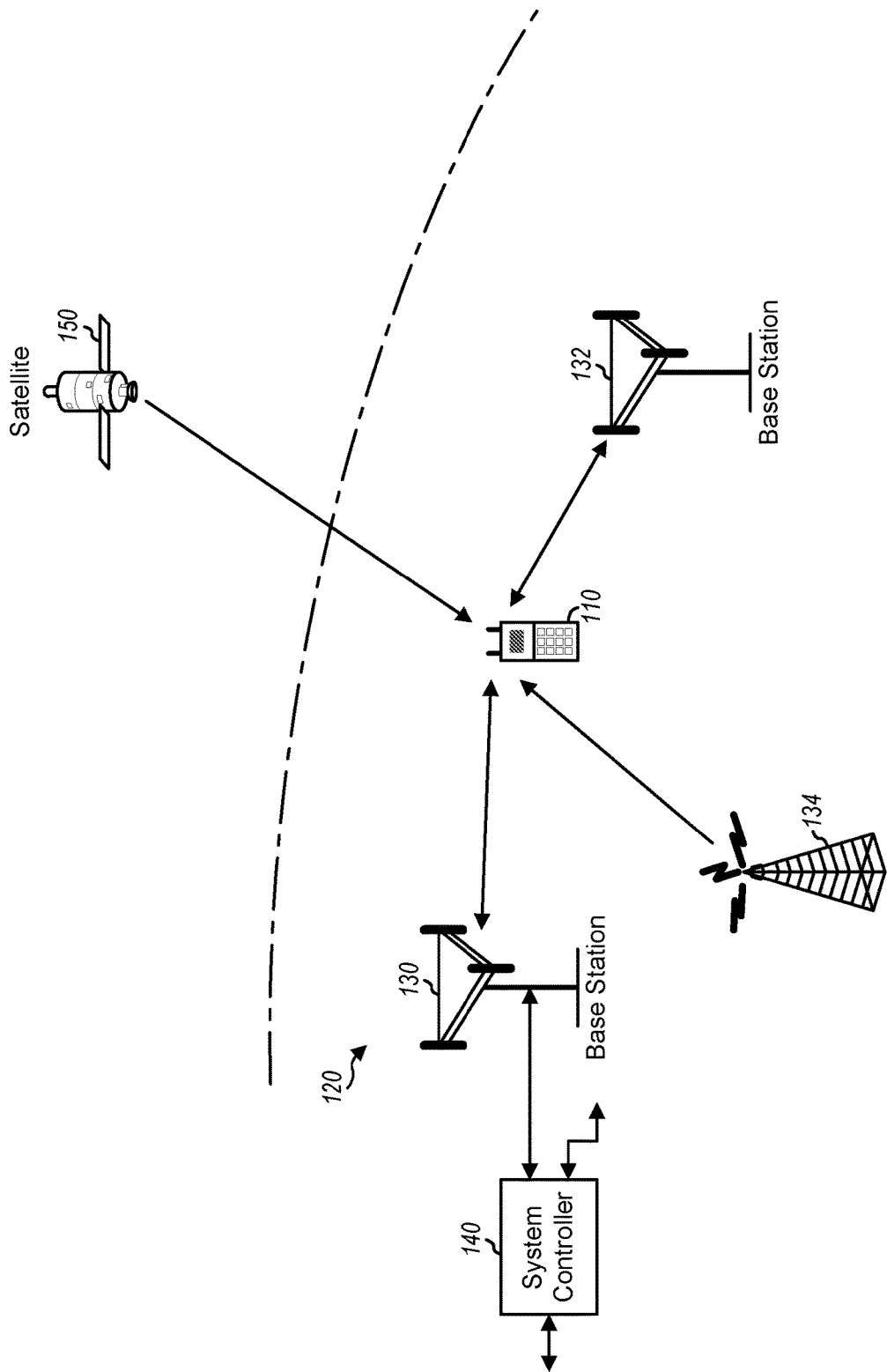
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1X, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
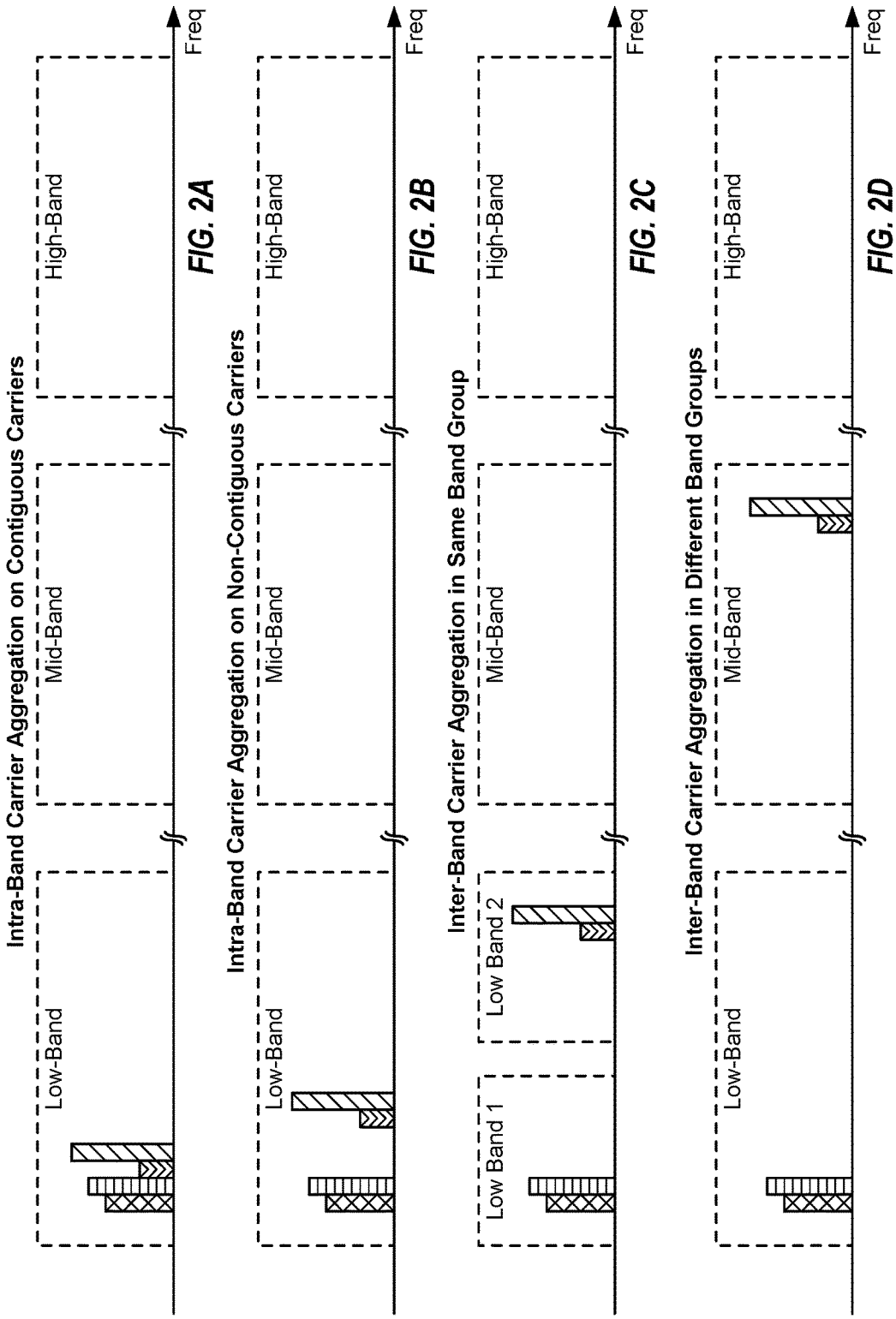
FIG. 2A is a graphical diagram showing an example of contiguous intra-band carrier-aggregation (CA).
FIG. 2B is a graphical diagram showing an example of non-contiguous intra-band CA.
FIG. 2C is a graphical diagram showing an example of inter-band CA in the same band group.
FIG. 2D is a graphical diagram showing an example of inter-band CA in different band groups.

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
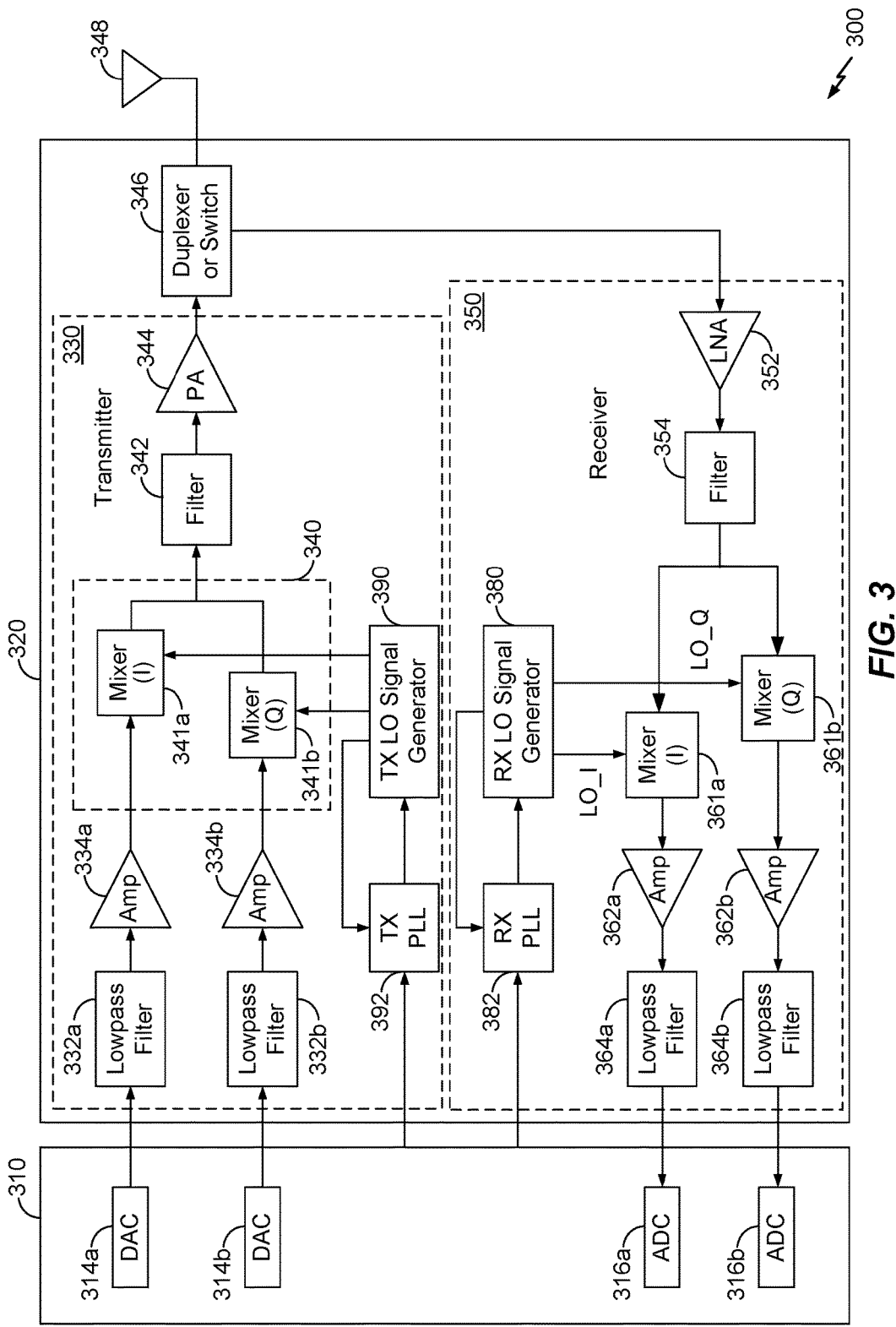
FIG. 3 is a block diagram showing a wireless device in which the exemplary techniques of the present disclosure may be implemented.

FIG. 3 is a block diagram showing a wireless device 300 in which the exemplary techniques of the present disclosure may be implemented. FIG. 3 shows an example of a transceiver 320. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter 330 and receiver 350. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing. Within the transmitter 330, lowpass filters 332a and 332b filter the I and Q analog transmit signals, respectively, to remove undesired images caused by the prior digital-to-analog conversion. Amplifiers (Amp) 334a and 334b amplify the signals from lowpass filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Down-conversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by lowpass filters 364a and 364b to obtain I and Q analog input signals, which are provided to data processor 310. In the exemplary embodiment shown, the data processor 310 includes analog-to-digital-converters (ADC's) 316a and 316b for converting the analog input signals into digital signals to be further processed by the data processor 310.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Wireless device 300 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

The power amplifier 344 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 344 can be configured to operate using one or more bias signals.

In an exemplary embodiment of the present disclosure, an adaptive bias circuit may be incorporated with or into the power amplifier 344 to provide one or more bias signals based on, for example only, the desired amplification or output power level, the strength of the input signal, and other factors. In a particular exemplary embodiment, an adaptive bias circuit may be configured to provide a bias signal to the power amplifier 344 based on the strength or power level of the radio frequency (RF) input signal. Those of skill in the art, however, will recognize that aspects described herein may be implemented in transmit architectures which differ from the architecture illustrated in FIG. 3.

Figure 4:
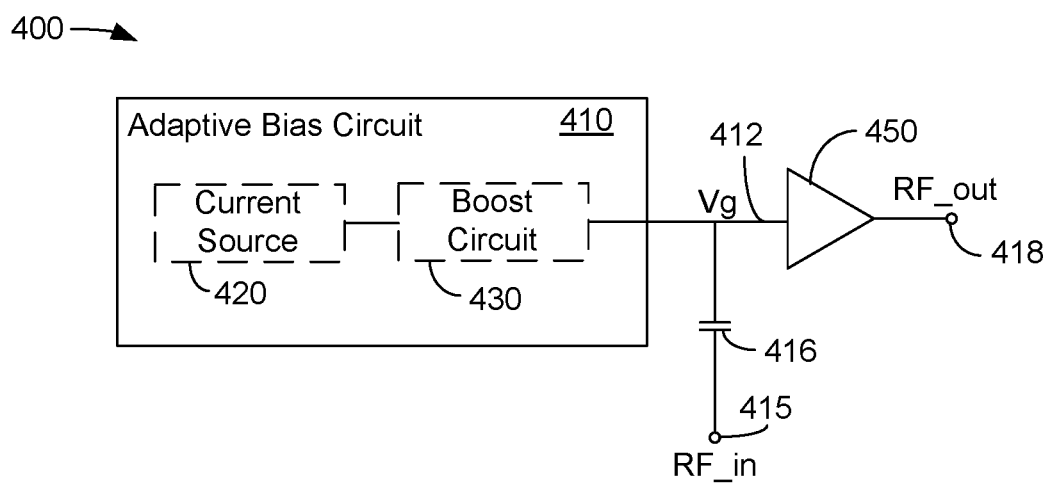
FIG. 4 is a schematic diagram illustrating an exemplary embodiment of an amplifier system including an exemplary embodiment of an adaptive bias circuit.

FIG. 4 is a schematic diagram illustrating an exemplary embodiment of an amplifier system 400 including an exemplary embodiment of an adaptive bias circuit. As alluded to above, the amplifier system 400 may be incorporated with or into a power amplifier, for example the power amplifier 344. The amplifier system 400 comprises an adaptive bias circuit 410 operatively coupled to an amplifier 450. The amplifier 450 can be any of a variety of amplifiers or amplifier circuits, such as, for example only, a driver amplifier, a main power amplifier, or any other amplifier that uses a bias signal to adjust at least some of its operation parameters. In an exemplary embodiment, the adaptive bias circuit 410 comprises a current source 420 and a boost circuit 430. The output of the adaptive bias circuit 410 on connection 412 can be provided to a control input of the amplifier 450. For example, if the amplifier 450 is implemented as a field effect transistor (FET), then the output of the adaptive bias circuit 410 on connection 412 can be provided to the gate of the amplifier 450. In an exemplary embodiment, a radio frequency (RF) input signal, RF_in, can be provided from an input terminal 415, through a capacitor 416 to the connection 412. In an exemplary embodiment, the capacitor 416 can be a direct current (DC) blocking capacitor configured to prevent a DC signal on connection 412 from appearing at the input terminal 415. In an exemplary embodiment, the RF_in signal on connection 415 can be a modulated baseband signal at DC or near DC. An example of an RF_in signal may be a modulated long term evolution (LTE) signal having a bandwidth of, for example, approximately 10 MHz to approximately 40 MHz.

In an exemplary embodiment, the adaptive bias circuit 410 can provide a range of bias voltages at least partly based on one or both of the input power level and the desired strength or power level of a desired transmit signal. For example, at low power levels, the adaptive bias circuit 410 provides a low level bias signal and also provides a low input impedance path between the current source 420 and the amplifier 450. At higher power levels, the boost circuit 430 provides bias voltage and current to the amplifier 450 in addition to the bias voltage and current provided by the current source 420, while also providing a low input impedance path between the current source 420 and the amplifier 450. The current source 420 can be any bias circuitry that can supply a bias signal to the amplifier 450, through the boost circuit 430, while providing a low input impedance at any frequency of the RF-in signal. As used herein, the term bias signal may include a voltage, a current, or a combination of voltage and current.

Figure 5:
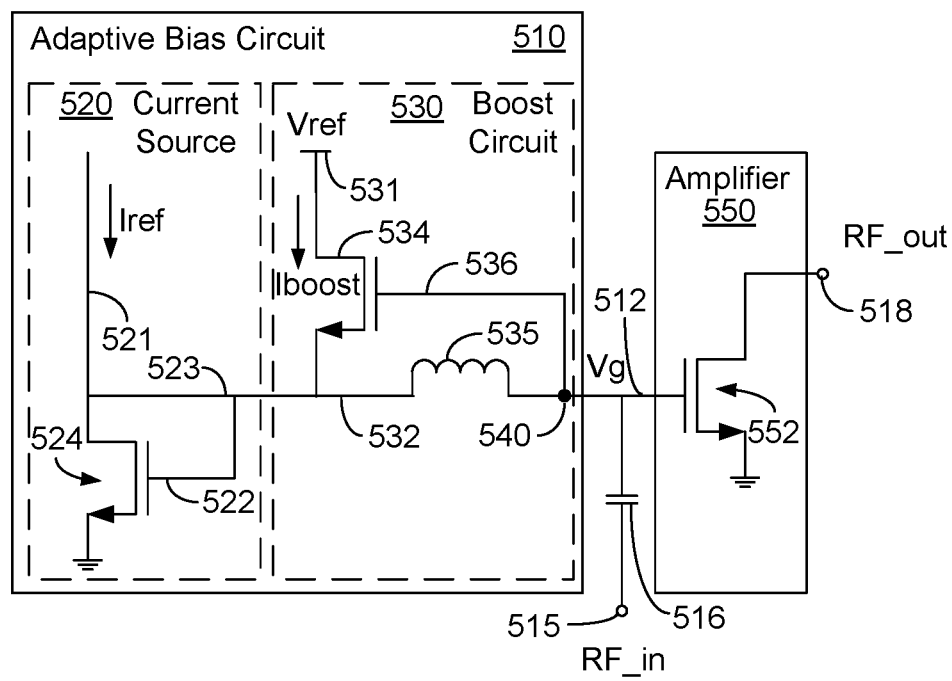
FIG. 5 is a schematic diagram illustrating an exemplary embodiment of an amplifier system including an exemplary embodiment of an adaptive bias circuit.

FIG. 5 is a schematic diagram illustrating an exemplary embodiment of an amplifier system 500 including an exemplary embodiment of an adaptive bias circuit. The amplifier system 500 may be incorporated with or into a power amplifier, for example the power amplifier 344. In an exemplary embodiment, the amplifier system 500 may comprise an adaptive bias circuit 510 operatively coupled to an amplifier 550. In an exemplary embodiment, the amplifier 550 comprises a transistor 552, which, in this example, is a FET. In an exemplary embodiment, the amplifier 550 is implemented as a single-ended circuit configured to receive a single-ended input signal. The transistor 552 may be a "common source" transistor having a source coupled to ground and a drain coupled to an RF output, RF_out, at output terminal 518. In an exemplary embodiment, the adaptive bias circuit 510 comprises a current source 520 and a boost circuit 530. An RF input signal, RF_in, is provided from an input terminal 515, through a capacitor 516 to the connection 512. The connection 512 may be operatively coupled to a gate of the transistor 552. The RF_in signal at connection 515 may be similar to the RF_in signal described in FIG. 4. In an exemplary embodiment, an example of an RF_in signal may be a modulated long term evolution (LTE) signal having a bandwidth of, for example, approximately 10 MHz to approximately 40 MHz.

In an exemplary embodiment, the current source 520 may comprise a transistor 524 configured as a current source. The drain and the gate of the transistor 524 may be coupled together by connection 522 at the connection 523. The current, Iref, may be provided over connections 521 and 523 to the boost circuit 530.

In an exemplary embodiment, the boost circuit 530 may comprise a transistor 534 and an inductor 535. A reference voltage, Vref, may be provided to the drain of the transistor 534 over connection 531. The inductor 535 may be coupled between the gate of the transistor 534 on connection 536 and the source of the transistor 534 on connection 532, and may be coupled to the transistor 552 over connection 512 at a node 540. The gate voltage of the transistor 552 at node 540 is illustrated as Vg. The inductance value of the inductor 535 can determine a voltage difference between the source of the transistor 534 at connection 532 and the gate of the transistor 534 on connection 536, which is the node 540. The gate-source voltage of the transistor 534 may be referred to as Vgs. The Vgs of the transistor 534 is at least partially determined by the impedance at the node 540. The impedance at the node 540 is related to the voltage difference (Vgs), and is determined according to jωL, where ω is 2*pi*frequency (carrier frequency) and L is the inductance of the inductor 535. Therefore, the inductance value chosen for the inductor 535 is at least partially dependent upon the carrier frequency of each communication band supported by the amplifier system 500. For example, the carrier frequency for a first communication band, B1, may be 2.1 GHz and the carrier frequency for a second communication band, B41, may be 2.6 GHz, respectively. The gate-source voltage, Vgs, between connections 536 and 532 at which the boost circuit 530 begins providing additional bias current can be at least partially controlled by the choice of the value of the inductor 535. For example, in an exemplary embodiment, at a carrier frequency of 2.1 GHz, the value of the inductor 535 may be chosen to be 2.5 nanoHenrys (nH), and at a carrier frequency of 2.6 GHz, the value of the inductor 535 may be chosen to be 2.0 nH. The value of the inductor 535 can be chosen to establish, or set, the input power level at which the adaptive bias circuit 510 begins providing additional bias current to adaptively bias the amplifier 550. Therefore, the amount of additional bias current provided by the adaptive bias circuit 510 is at least partially dependent upon the value of the inductor 535 and the size of the transistor 534, which at least partly determines an amount of current that may flow through the transistor 534.

In an exemplary embodiment, the adaptive bias circuit 510 can provide a range of bias voltages and bias currents based at least partly on one or both of the input power level at connection 515 and the desired strength or power level of a desired transmit signal at connection 518. For example, at low power levels, the adaptive bias circuit 510 provides a low level bias signal and also provides a low input impedance path between the current source 520 and the amplifier 550. For example, at low power levels the transistor 534 operates in what is referred to as a "cut off" region because the voltage at the gate of the transistor 534 on connection 536 is substantially the same as the voltage at the source of the transistor 534 on connection 532. When in or near the cut off state, the transistor 534 is non-conductive and the inductor 535 provides the transistor 552 with a low impedance path to the current source 520.

In an exemplary embodiment, a maximum linear power output for an LTE transmitter, such as the amplifier 550, may be approximately 29 dBm and a maximum instantaneous power output for an LTE transmitter may be approximately 33 dBm. In an exemplary embodiment, the term "high power" may comprise approximately 23 dBm to approximately 33 dBm or higher. Different operating standards may have different power levels. The term "low power" may comprise approximately less than 23 dBm, and the terms "high power" and "low power" may refer to power levels that are relative to each other.

In an exemplary embodiment, the relationship between the level of the input signal at connection 515 to the amount of additional bias current provided by the transistor 534 can at least partially depend on the peak-to-average power ratio of the desired output signal.

In an exemplary embodiment, the power level at which the transistor 534 turns on can at least partly be controlled by the impedance at the connection 512 (node 540), which is the gate of the transistor 552. For example, if the impedance at the connection 512 is in a range of several hundred ohms, the gate voltage, Vg could be high enough to turn on the transistor 534 even at, for example, a relatively low −10 dBm of input power. If the impedance at connection 512 is low, such as, for example, a few ohms, the gate voltage, Vg, at which the transistor 534 may turn on can be very small such that the transistor 534 will turn on at, for example, a relatively high 10 dBm of input power.

At higher power levels, and as the input power level increases, the voltage, Vg, on connection 512 increases, and the inductor 535 operates as a choke, establishing a voltage difference between the voltage at the gate of the transistor 534 on connection 536 and the voltage at the source of the transistor 534 on connection 532. Once the difference in voltage between connection 536 and connection 532 reaches a threshold value, the transistor 534 becomes conductive and supplies additional bias current, Iboost, to the connection 532, thus contributing additional bias current, Iboost, to the original bias current, Iref, and thus increasing the voltage and the current provided to the gate of the transistor 552 on connection 512. The inductor 535 also provides the transistor 552 with a low impedance path to the current source 520. The threshold voltage at which the transistor 534 becomes conductive is dependent upon a number of factors including, but not limited to, the size of the transistor 534, the power level of the input signal, RF_in, and the desired power output range of the amplifier 550. In an exemplary embodiment, the bias voltage at the connection 512 may range from approximately 0.3V-0.4V for a low power signal, to approximately 1V-2V at maximum instantaneous power of approximately 33 dBm. At the point at which the voltage on connection 536 becomes sufficiently large to turn on the transistor 534, the transistor 534 provides additional voltage and current to increase the voltage, Vg, at connection 512 to improve the linearity of the amplifier 550.

Figure 6:
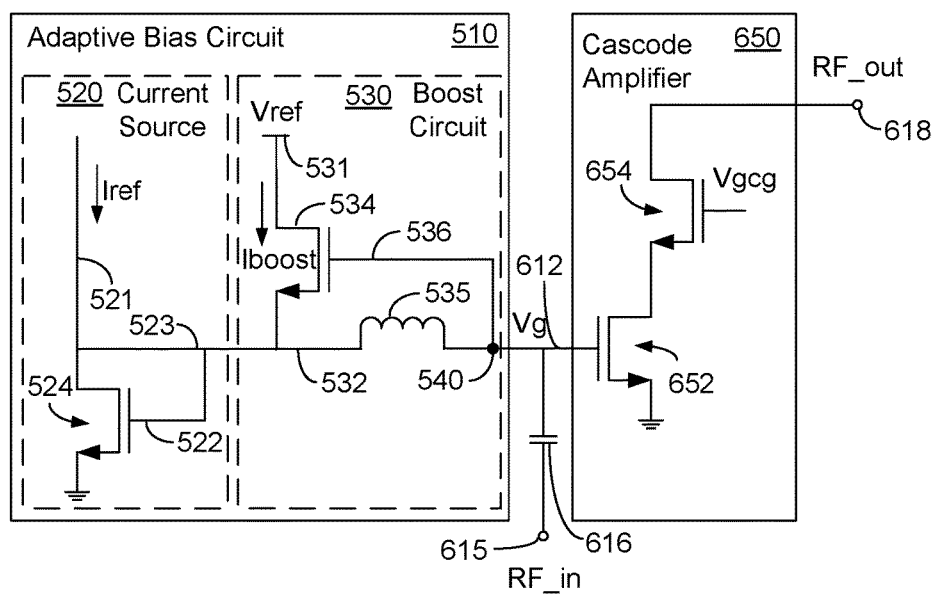
FIG. 6 is a schematic diagram illustrating an alternative exemplary embodiment of an amplifier system including an alternative exemplary embodiment of an amplifier.

FIG. 6 is a schematic diagram illustrating an alternative exemplary embodiment of an amplifier system 600 including an alternative exemplary embodiment of an amplifier. The amplifier system 600 may be incorporated with or into a power amplifier, for example the power amplifier 344. The amplifier system 600 comprises an adaptive bias circuit 510 operatively coupled to an amplifier 650. The adaptive bias circuit 510 shown in FIG. 6 is identical to that shown in FIG. 5, and details thereof will not be repeated. In an exemplary embodiment, the amplifier 650 comprises a cascode arrangement having a transistor 652 coupled to a transistor 654. The transistor 652 is a common source transistor having a drain that is coupled to the source of the transistor 654. The RF output signal, RF_out, on connection 618 is taken from the drain of the transistor 654. An RF input signal, RF_in, is provided over connection 615, through the capacitor 616 and then to the gate of the transistor 652 at connection 612. The transistor 654 is biased by a voltage, Vgcg, provided to its gate. The adaptive bias circuit 510 operates as described above to provide a bias signal and a low impedance path to the transistor 652.

Figure 7:
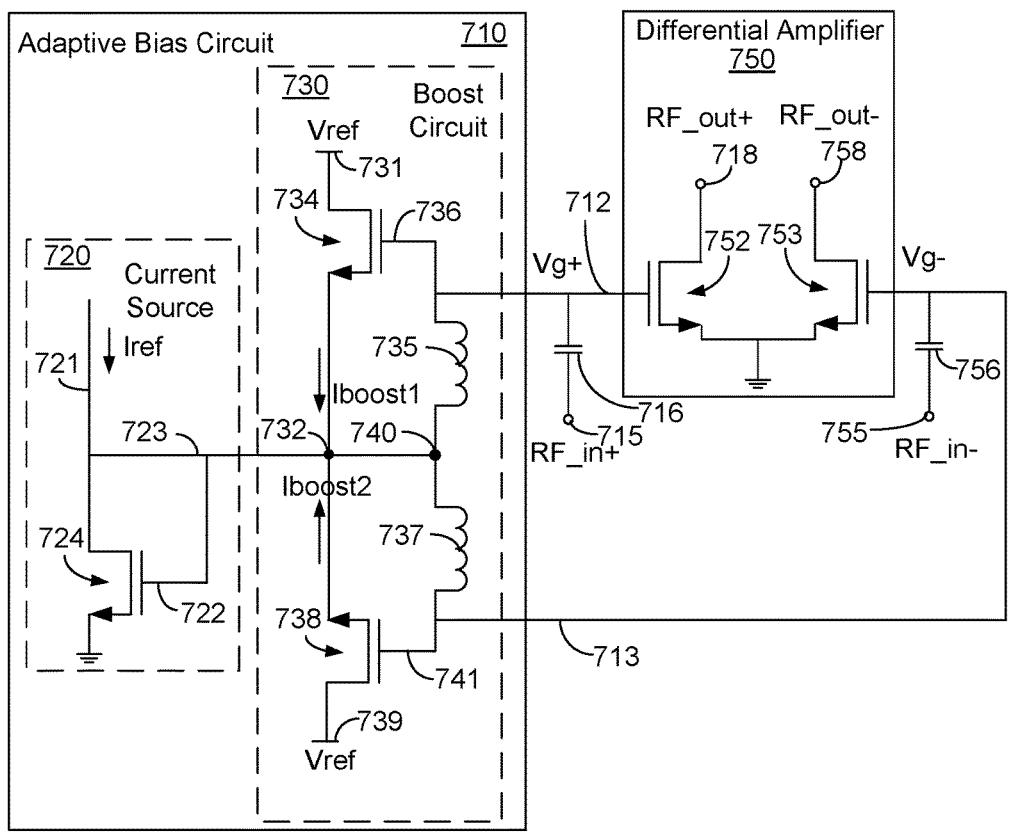
FIG. 7 is a schematic diagram illustrating an alternative exemplary embodiment of an amplifier system including an alternative exemplary embodiment of an adaptive bias circuit and an alternative embodiment of an amplifier.

FIG. 7 is a schematic diagram illustrating an alternative exemplary embodiment of an amplifier system 700 including an alternative exemplary embodiment of an adaptive bias circuit and an alternative embodiment of an amplifier. The amplifier system 700 may be incorporated with or into a power amplifier, for example the power amplifier 344. The amplifier system 700 comprises an adaptive bias circuit 710 operatively coupled to an amplifier 750. In an exemplary embodiment, the amplifier 750 is configured as a differential amplifier. A differential amplifier is configured to receive two input signals, referred to as a "differential signal." A differential signal is one that includes two complementary signals on separate conductors. In an exemplary embodiment, the amplifier 750 comprises a transistor 752 and a transistor 753. The transistors 752 and 753 are each configured as a FET. The transistors 752 and 753 may be "common source" transistors having their respective source terminals coupled to ground and a drain coupled to a respective RF output, RF_out+ and RF_out−, at respective output terminals 718 and 758. A differential input signal having an RF_in+ signal is provided over terminal 715, through a capacitor 716 and to the gate of the transistor 752 on connection 712. A differential input signal having an RF_in− signal is provided over terminal 755, through a capacitor 756 and to the gate of the transistor 753 on connection 713.

In an exemplary embodiment, the adaptive bias circuit 710 comprises a current source 720 and a boost circuit 730. In an exemplary embodiment, the current source 720 may comprise a transistor 724 configured as a current source. The drain and the gate of the transistor 724 may be coupled together by connection 722 at the connection 723. The current, Iref, may be provided over connections 721 and 723 to the boost circuit 730.

In an exemplary embodiment, the boost circuit 730 may comprise a transistor 734, an inductor 735, a transistor 738 and an inductor 737. A reference voltage, Vref, may be provided to the drain of the transistor 734 over connection 731 and to the drain of the transistor 738 over connection 739. The inductor 735 may be coupled between the gate of the transistor 734 and a node 740. The inductor 737 may be coupled between the gate of the transistor 738 and the node 740. In an exemplary embodiment, the boost circuit 730 is configured to provide two bias signals to the amplifier 750. A first bias signal may be provided over connection 712 to the gate of the transistor 752 and a second bias signal may be provided over connection 713 to the gate of the transistor 753.

In an exemplary embodiment, the adaptive bias circuit 710 can provide a range of bias voltages and bias currents based at least partly on one or both of the input power level and the desired strength or power level of a desired transmit signal. For example, at low power levels, the adaptive bias circuit 710 provides a low level bias signal and also provides a low input impedance path between the current source 720 and the amplifier 750. For example, at low power levels the transistor 734 and the transistor 738 operate in what is referred to as a "cut off" region because the voltage at the gate of the transistor 734 on connection 736 and the gate of the transistor 738 on connection 741 is substantially the same as the voltage on the source of the transistor 734 on node 740 and substantially the same as the voltage on the source of the transistor 738 on node 740. When in or near the cut off state, the transistor 734 and the transistor 738 are non-conductive and the inductors 735 and 737 provide the transistors 752 and 753 with a low impedance path to the current source 720.

At higher power levels, and as the input power level increases, the voltage, Vg+, on connection 712 increases, and the inductor 735 operates as a choke, establishing a voltage difference between the voltage at the gate of the transistor 734 on connection 736 and the voltage at the source of the transistor 734 on node 740. Once the difference in voltage between connection 736 and node 740 reaches a threshold value, the transistor 734 becomes conductive and supplies a current, Iboost1, to the connection 732 and the node 740, thus contributing additional bias current, Iboost1, to the original bias current, Iref, and thus increasing the voltage and the current provided to the gate of the transistor 752 on connection 712. The inductor 735 provides the transistor 752 with a low impedance path to the current source 720.

Similarly, at higher power levels, and as the input power level increases, the voltage, Vg−, on connection 713 increases, and the inductor 737 operates as a choke, establishing a voltage difference between the voltage at the gate of the transistor 738 on connection 741 and the voltage at the source of the transistor 738 on node 740. Once the difference in voltage between connection 741 and the node 740 reaches a threshold value, the transistor 738 becomes conductive and supplies a current, Iboost2, to the connection 732 and the node 740, thus contributing additional bias current, Iboost2, to the original bias current, Iref, and thus increasing the voltage and the current provided to the gate of the transistor 753 on connection 713. The inductor 737 provides the transistor 753 with a low impedance path to the current source 720.

The threshold voltage at which the transistors 734 and 738 become conductive is dependent upon a number of factors including, but not limited to, the size of the transistors 734 and 738, the power level of the input signals RF_in+ and RF_in−, and the desired power output range of the amplifier 750.

At higher power levels, the transistor 734 and the transistor 738 in the boost circuit 730 become conductive and provide bias voltage and current in addition to the bias voltage and current provided by the current source 720 to the gate of the transistor 752 on connection 712 and to the gate of the transistor 753 on connection 713, while providing a low impedance path between the transistor 752 and the current source 720, and between the transistor 753 and the current source 720. At the point at which the voltage on connection 736 and connection 741 becomes sufficiently large to turn on the transistor 734 and the transistor 738, respectively, the transistor 734 and the transistor 738 provide additional voltage and current to increase the voltage, Vg+, at connection 712 and the voltage, Vg−, at connection 713 to improve the linearity of the amplifier 750. The values of the inductors 735 and 737 may be chosen similarly to the value of the inductor 535 described above.

Figure 8:
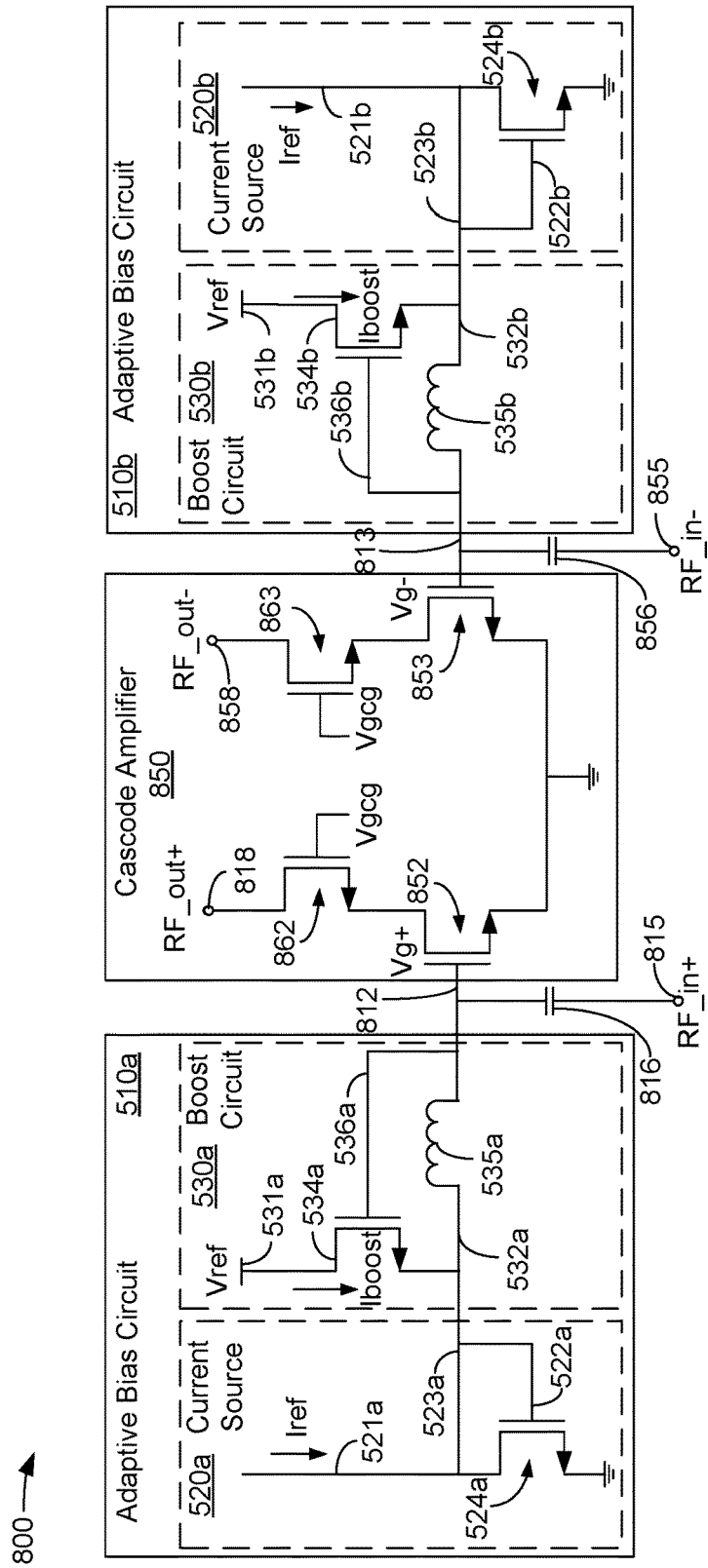
FIG. 8 is a schematic diagram illustrating an alternative exemplary embodiment of an amplifier system including an alternative exemplary embodiment of an adaptive bias circuit and an alternative embodiment of an amplifier.

FIG. 8 is a schematic diagram illustrating an alternative exemplary embodiment of an amplifier system 800 including an alternative exemplary embodiment of an adaptive bias circuit and an alternative embodiment of an amplifier. The amplifier system 800 may be incorporated with or into a power amplifier, for example the power amplifier 344. The amplifier system 800 comprises an adaptive bias circuit 510a and an adaptive bias circuit 510b operatively coupled to an amplifier 850. The adaptive bias circuits 510a and 510b are similar to the adaptive bias circuit 510. In an exemplary embodiment, the amplifier 850 is configured as a differential amplifier in a cascode arrangement. In an exemplary embodiment, the amplifier 850 comprises a cascode arrangement having a transistor 852 coupled to a transistor 862. The transistor 852 is a common source transistor having a drain that is coupled to the source of the transistor 862. The amplifier 850 also comprises a cascode arrangement having a transistor 853 coupled to a transistor 863. The transistor 853 is a common source transistor having a drain that is coupled to the source of the transistor 863. The RF output signal, RF_out+, on connection 818 is taken from the drain of the transistor 862 and the RF output signal, RF_out−, on connection 858 is taken from the drain of the transistor 863.

An RF input signal, RF_in+, is provided over connection 815, through the capacitor 816 and then to the gate of the transistor 852 at connection 812. An RF input signal, RF_in−, is provided over connection 855, through the capacitor 856 and then to the gate of the transistor 853 at connection 813. The transistor 862 is biased by a voltage, Vgcg, provided to its gate and the transistor 863 is biased by a voltage, Vgcg, provided to its gate.

In an exemplary embodiment, the adaptive bias circuit 510a comprises a current source 520a and a boost circuit 530a. In an exemplary embodiment, the current source 520a may comprise a transistor 524a configured as a current source. The drain and the gate of the transistor 524a may be coupled together by connection 522a at the connection 523a. The current, Iref, may be provided over connection 523a to the boost circuit 530a.

In an exemplary embodiment, the boost circuit 530a may comprise a transistor 534a and an inductor 535a. A reference voltage, Vref, may be provided to the drain of the transistor 534a over connection 531a. The inductor 535a may be coupled between the gate and the source of the transistor 534a between connections 532a and 536a, and coupled to the transistor 852 over connection 812. The gate voltage of the transistor 852 is illustrated as Vg+.

In an exemplary embodiment, the adaptive bias circuit 510b comprises a current source 520b and a boost circuit 530b. In an exemplary embodiment, the current source 520b may comprise a transistor 524b configured as a current source. The drain and the gate of the transistor 524b may be coupled together by connection 522b at the connection 523b. The current, Iref, may be provided over connection 523b to the boost circuit 530b.

In an exemplary embodiment, the boost circuit 530b may comprise a transistor 534b and an inductor 535b. A reference voltage, Vref, may be provided to the drain of the transistor 534b over connection 531b. The inductor 535b may be coupled between the gate and the source of the transistor 534b between connections 532b and 536b, and coupled to the transistor 853 over connection 813. The gate voltage of the transistor 853 is illustrated as Vg−.

In an exemplary embodiment, the adaptive bias circuits 510a and 510b can provide a range of bias voltages based at least partly on one or both of the input power level and the desired strength or power level of a desired transmit signal. For example, at low power levels, the adaptive bias circuits 510a and 510b provide a low level bias signal and also provide a low input impedance path between the current source 520a and the amplifier 850 and between the current source 520b and the amplifier 850. For example, at low power levels, the transistor 534a and the transistor 534b operate in what is referred to as a "cut off" region because the voltage at the gate on connection 536a is substantially the same as the voltage on the source on connection 532a, and the voltage at the gate on connection 536b is substantially the same as the voltage on the source on connection 532b. When in or near the cut off state, the transistor 534a and the transistor 534b are non-conductive and the inductor 535a and the inductor 535b provide the transistor 852 and the transistor 853, respectively, with a low impedance path to the respective current source 520a and 520b.

At higher power levels, the transistor 534a in the boost circuit 530a and the transistor 534b in the boost circuit 530b become conductive and provide bias current in addition to the bias current provided by the current source 520a and the current source 520b to the gate of the transistor 852 on connection 812 and to the gate of the transistor 853 on connection 813, respectively. At the point at which the voltage on connections 536a and 536b, respectively, become sufficiently large to turn on the respective transistor 534a and 534b, the transistor 534a and the transistor 534b provide additional voltage and current to increase the voltage, Vg+, at connection 812 and the voltage Vg− at connection 813 to improve the linearity of the amplifier 850, while the inductor 535a provides a low impedance path from the transistor 852 to the current source 520a and the inductor 535b provides a low impedance path between the transistor 853 and the current source 520b.

Figure 9:
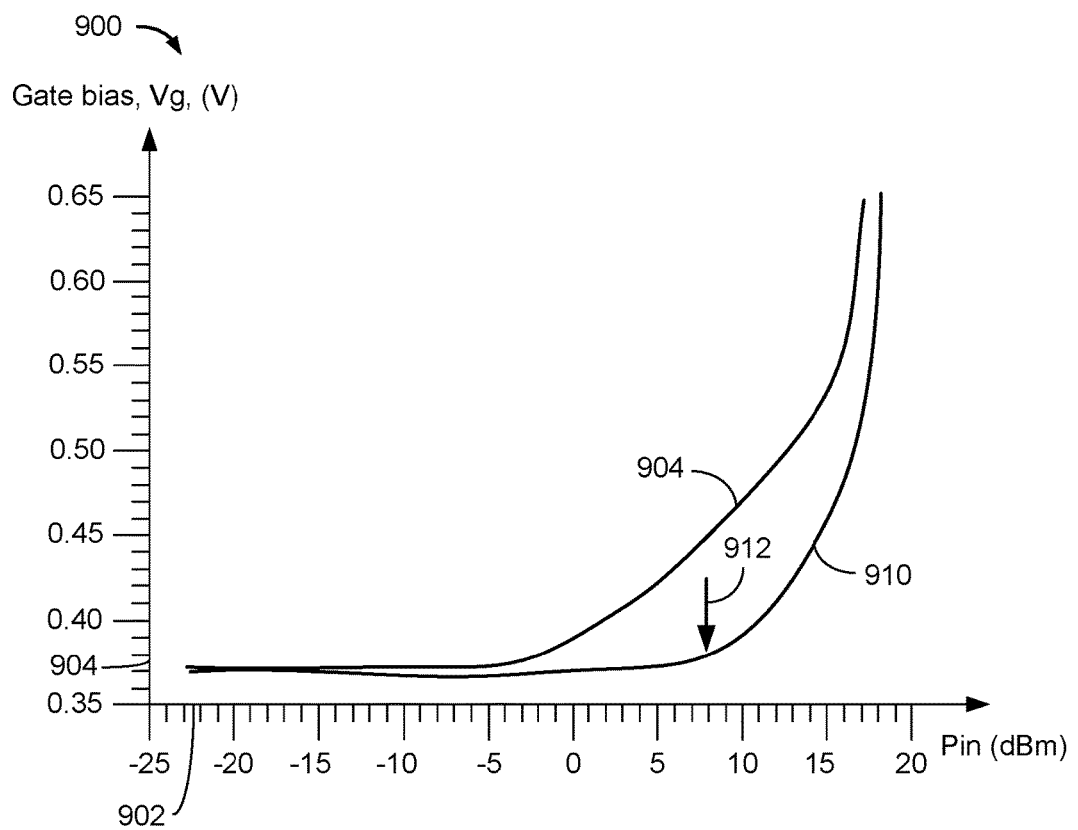
FIG. 9 is a graphical illustration of the operation of an exemplary embodiment of an adaptive bias circuit.

FIG. 9 is a graphical illustration 900 of the operation of an exemplary embodiment of an adaptive bias circuit. The horizontal axis 902 refers to an exemplary input power in dBm of an RF input signal at connection 515, for example. The vertical axis 904 refers to the bias voltage, Vg, applied to the gate of the transistor 552. The trace 904 refers to a prior gate bias voltage signal. The trace 910 shows a gate bias voltage signal for an exemplary embodiment of the adaptive bias circuit described herein. In an exemplary embodiment, at an approximate threshold input power level of 8 dBm, shown by the arrow 912, at the input on connection 515, the boost circuit 530 begins providing additional bias voltage (and current) to the amplifier 550, as reflected by the increase in gate voltage (Vg) applied to the gate of the transistor 552 in the amplifier 550 (FIG. 5) and the gate of the transistor 534 in the boost circuit 530. Increasing the gate voltage (Vg) applied to the gate of the transistor 534 in the boost circuit 530 increases the current flowing through the transistor 534, and increases the bias current at the gate of the transistor 552.

Figure 10:
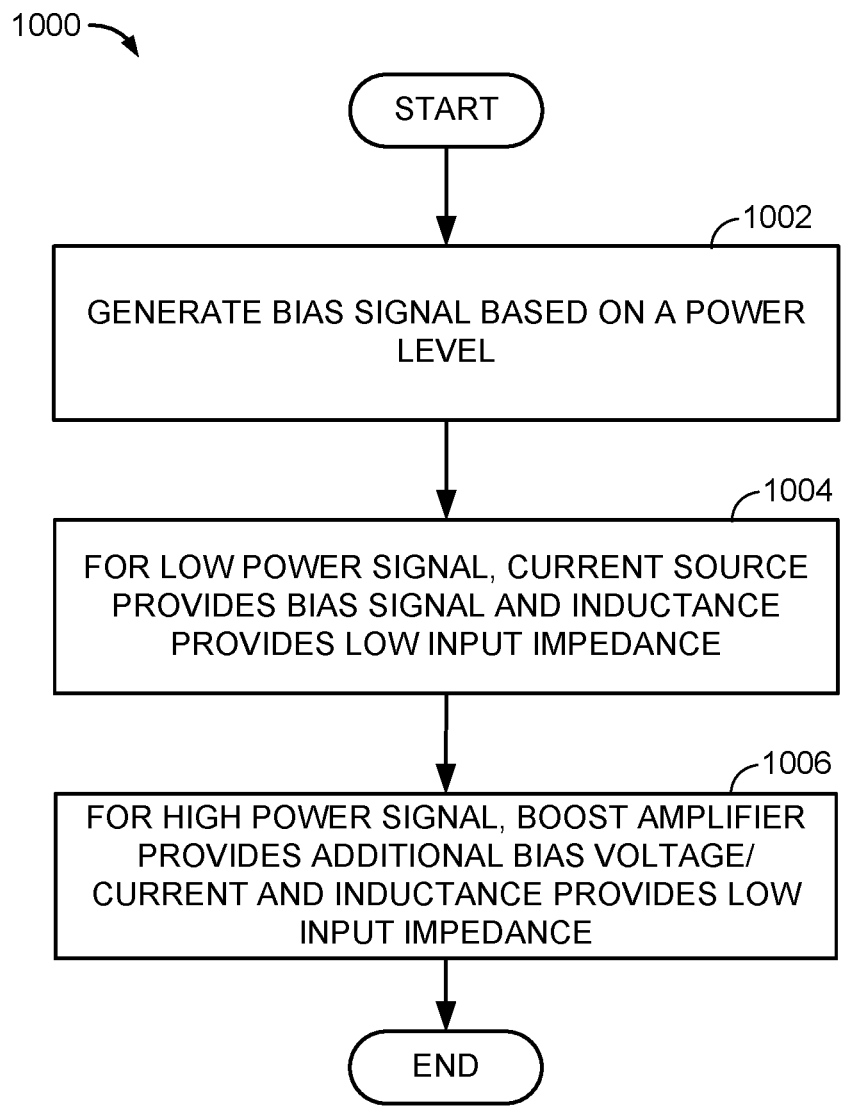
FIG. 10 is a flow chart describing the operation of an exemplary embodiment of an adaptive bias circuit.

FIG. 10 is a flow chart 1000 describing the operation of an exemplary embodiment of an adaptive bias circuit. The blocks in the method 1000 can be performed in or out of the order shown, and in some embodiments, can be performed at least in part in parallel.

In block 1002, a bias signal is generated based on a power level. In an exemplary embodiment, the bias signal may be generated based on the level of an input signal, or based on a desired power output level of an amplifier. In block 1004, for a low power signal, that is, a signal having a first power level that may be at or below a threshold, an adaptive bias circuit provides a bias signal and also provides a low impedance input path to an amplifier.

In block 1006, for a high power signal, that is, a signal having a second power level that may be at or above a threshold, an adaptive bias circuit provides an additional bias signal that may have a higher voltage and/or current than the original bias signal and also provides a low impedance input path to an amplifier.

Figure 11:
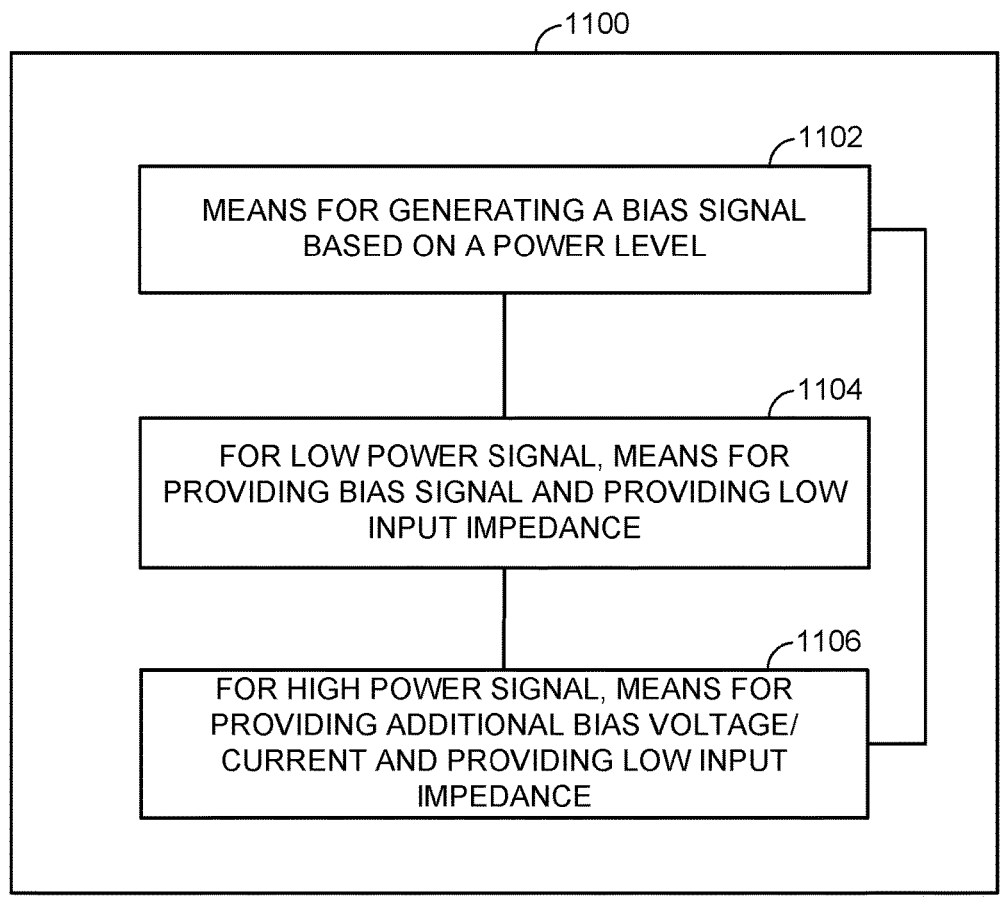
FIG. 11 is a functional block diagram of an apparatus for adaptively biasing an amplifier.

FIG. 11 is a functional block diagram of an apparatus 1100 for adaptively biasing an amplifier. The apparatus 1100 comprises means 1102 for generating a bias signal based on a power level. In certain embodiments, the means 1102 for generating a bias signal based on a power level can be configured to perform one or more of the function described in operation block 1002 of method 1000 (FIG. 10). In an exemplary embodiment, the means 1102 for generating a bias signal based on a power level may comprise the adaptive bias circuit 510 and various embodiments thereof.

The apparatus 1100 further comprises means 1104 for providing a bias signal and providing a low impedance input path to an amplifier. In certain embodiments, the means 1104 for providing a bias signal and providing a low impedance input path to an amplifier can be configured to perform one or more of the function described in operation block 1004 of method 1000 (FIG. 10). In an exemplary embodiment, the means 1104 for providing a bias signal and providing a low impedance input path to an amplifier may comprise the adaptive bias circuit 510 and various embodiments thereof.

The apparatus 1100 further comprises means 1106 for providing an additional bias signal and providing a low impedance input path to an amplifier. In certain embodiments, the means 1106 for providing an additional bias signal and providing a low impedance input path to an amplifier can be configured to perform one or more of the function described in operation block 1006 of method 1000 (FIG. 10). In an exemplary embodiment, the means 1106 for providing an additional bias signal and providing a low impedance input path to an amplifier may comprise the adaptive bias circuit 510 and various embodiments thereof.

Figure 12:
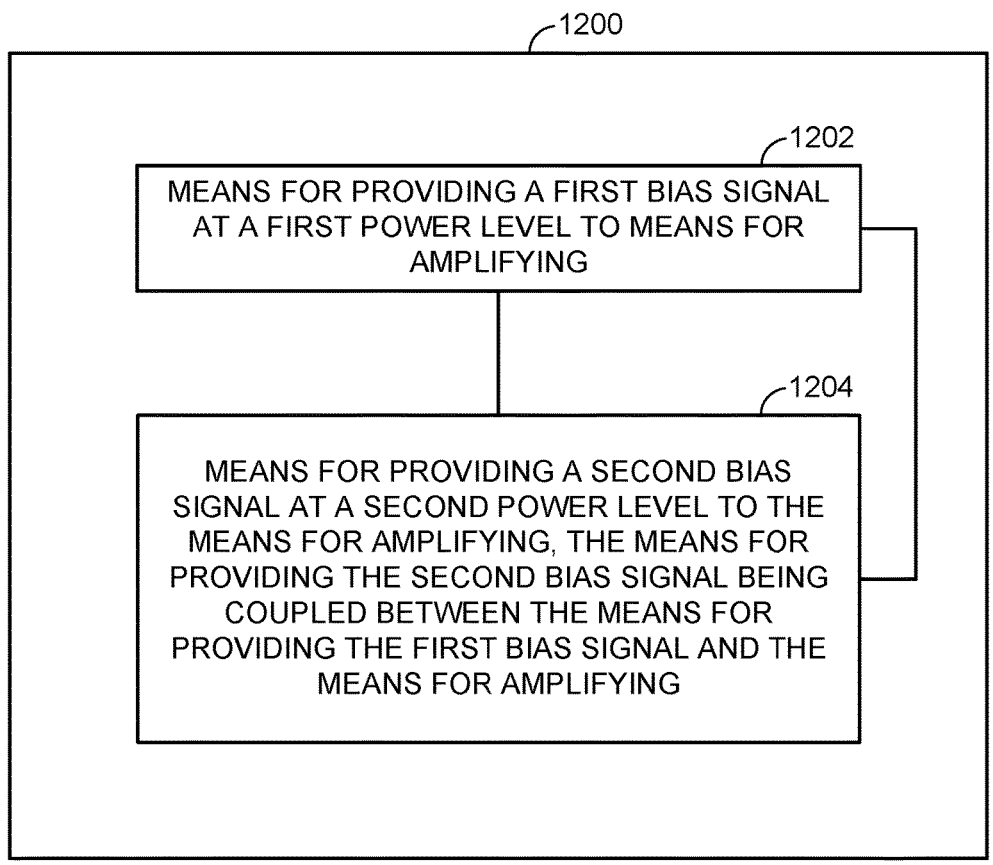
FIG. 12 is a functional block diagram of an apparatus for adaptively biasing an amplifier.

FIG. 12 is a functional block diagram of an apparatus 1200 for adaptively biasing an amplifier. The apparatus 1200 comprises means 1202 for providing a first bias signal at a first power level to means for amplifying. In an exemplary embodiment, the means 1202 for providing a first bias signal at a first power level to means for amplifying may comprise elements of the adaptive bias circuit 510 and various embodiments thereof, for example elements of the current source 520. In some embodiments, the means for amplifying comprise an amplifier as described with respect to 450, 550, 650, 750, and/or 850.

The apparatus 1200 further comprises means 1204 for providing a second bias signal at a second power level to the means for amplifying, the means for providing the second bias signal being coupled between the means for providing the first bias signal and the means for amplifying. In an exemplary embodiment, the means 1204 for providing the second bias signal being coupled between the means for providing the first bias signal and the means for amplifying may comprise elements of the adaptive bias circuit 510 and various embodiments thereof, for example elements of the boost circuit 530 and various embodiments thereof.

The embodiments of the adaptive bias circuit described herein can be configured to provide high bias current to enhance linearity of an amplifier for high power range operation, and can also be configured to provide low bias current for lower power range operation, to achieve high efficiency over a desired power range. At all power ranges, the adaptive bias circuit also provides low input impedance, which can improve data rate transmission, particularly at low input frequencies. The embodiments of the adaptive bias circuit described herein can be configured to enable low input impedance at low frequencies as well as provide high bias current at high power ranges, thereby providing a low input impedance at low frequencies for all power levels, and/or providing an increased bias voltage to enable sufficient current supply for high power ranges.

The amplifier system and the adaptive bias circuit described herein may be implemented on one or more ICs, analog ICs, RFICs, mixed-signal ICs, ASICs, printed circuit boards (PCBs), electronic devices, etc. The amplifier system and the adaptive bias circuit may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the amplifier system and the adaptive bias circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A circuit, comprising:
   a first transistor comprising a gate, a source, and a drain;
   an inductor coupled between the gate and the source of the first transistor; and
   a node located between the gate and the inductor, wherein the source is further coupled to a current source and the gate is further coupled to an amplifier, and the node is coupled to a gate of a transistor in the amplifier.

2. The circuit of claim 1, wherein the current source comprises a second transistor comprising a source, a gate, and a drain, and wherein the source of the first transistor is coupled to the gate and the drain of the second transistor.

3. The circuit of claim 2, wherein the source of the second transistor is coupled to ground.

4. The circuit of claim 1, further comprising a capacitor coupled between a signal input and the gate.

5. The circuit of claim 4, wherein the signal input comprises a radio frequency signal input.

6. The circuit of claim 1, wherein the circuit is implemented within a power amplifier.

7. The circuit of claim 1, wherein the drain is coupled to a reference voltage.

8. The circuit of claim 1, wherein the amplifier is a single-ended amplifier.

9. The circuit of claim 1, wherein the amplifier is a differential amplifier.

10. The circuit of claim 9, further comprising a second transistor comprising a second gate, a second source, and a second drain, and a second inductor, wherein a first node located between the first gate and the first inductor is coupled to a positive RF input and a first transistor in the differential amplifier, and wherein a second node located between the second gate and the second inductor is coupled to a negative RF input and a second transistor in the differential amplifier.

11. A circuit, comprising:
    means for providing a first bias signal at a first power level to means for amplifying; and
    means for providing a second bias signal at a second power level to the means for amplifying, the means for providing the second bias signal being coupled between the means for providing the first bias signal and the means for amplifying, wherein the means for providing the second bias signal comprises means for selectively conducting based on a voltage at an element of the means for selectively conducting.

12. The circuit of claim 11, wherein the means for providing the second bias signal comprises means for providing a low impedance path between the means for providing the second bias signal and the means for amplifying at the first power level and at the second power level.

13. The circuit of claim 11, wherein the means for selectively conducting is conductive when the voltage exceeds a threshold value, and wherein the means for providing the second bias voltage provides the second bias voltage at the second power level when the means for selectively conducting is conductive.

14. The circuit of claim 11, wherein the means for amplifying comprises means for amplifying an input radio frequency signal to provide an output radio frequency signal.

15. The circuit of claim 14, wherein the first power level corresponds to a first desired RF output signal and the second power level corresponds to a second desired RF output signal.

16. A method for biasing an amplifier, comprising:
    providing a radio frequency (RF) input signal to an amplifier, the amplifier configured to provide an output signal;
    providing a bias signal to the amplifier when the RF input signal is at a first power level;
    providing an additional bias signal to the amplifier when the RF input signal is at a second power level;
    providing a low impedance input to the amplifier; and
    providing the additional bias signal to the amplifier when the RF input signal meets or exceeds a power threshold.

17. The method of claim 16, wherein the first power level is lower than the second power level.

18. The method of claim 16, wherein the RF input signal is a single-ended input signal.

19. The method of claim 16, wherein the RF input signal is a differential input signal.

20. The method of claim 16, wherein the additional bias signal comprises voltage and current in addition to the bias signal.

21. The circuit of claim 1, wherein the current source is configured to provide a bias signal to the amplifier.

22. The circuit of claim 1, wherein the gate is coupled to an input of the amplifier.

\* \* \* \* \*